(12) United States Patent
Lau et al.

(10) Patent No.: US 11,742,203 B2
(45) Date of Patent: Aug. 29, 2023

(54) METHOD FOR GROWING III-V COMPOUND SEMICONDUCTOR THIN FILMS ON SILICON-ON-INSULATORS

(71) Applicant: The Hong Kong University of Science and Technology, Hong Kong (CN)

(72) Inventors: Kei May Lau, Hong Kong (CN); Yu Han, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 246 days.

(21) Appl. No.: 16/801,224

(22) Filed: Feb. 26, 2020

(65) Prior Publication Data

US 2021/0265162 A1    Aug. 26, 2021

(51) Int. Cl.
*H01L 21/306* (2006.01)
*H01L 21/02* (2006.01)
*G02B 6/12* (2006.01)
*G02B 6/136* (2006.01)
*G02B 6/13* (2006.01)

(52) U.S. Cl.
CPC .... *H01L 21/02645* (2013.01); *G02B 6/12004* (2013.01); *G02B 6/131* (2013.01); *G02B 6/136* (2013.01); *H01L 21/0262* (2013.01); *H01L 21/02422* (2013.01); *H01L 21/02543* (2013.01); *H01L 21/02546* (2013.01); *G02B 2006/12061* (2013.01); *H01L 21/30608* (2013.01)

(58) Field of Classification Search
CPC .................. H01L 21/30608; H01L 21/30612
See application file for complete search history.

(56) References Cited

U.S. PATENT DOCUMENTS

| | | | |
|---|---|---|---|
| 4,004,957 A * | 1/1977 | Quintana | H01L 21/32134 257/E21.309 |
| 7,777,250 B2 | 8/2010 | Lochtefeld | |
| 8,173,551 B2 * | 5/2012 | Bai | H01L 21/02433 438/758 |
| 8,384,196 B2 | 2/2013 | Cheng et al. | |
| 8,759,203 B2 | 6/2014 | Wann et al. | |
| 8,765,510 B2 | 7/2014 | Lochtefeld | |
| 8,822,248 B2 | 9/2014 | Park | |
| 9,064,699 B2 | 6/2015 | Wang et al. | |
| 9,356,103 B2 | 5/2016 | Cheng | |
| 9,748,098 B2 | 8/2017 | Balakrishnan et al. | |

(Continued)

OTHER PUBLICATIONS

J. Z. Li et al., "Defect reduction of GaAs epitaxy on Si (001) using selective aspect ratio trapping" Appl. Phys. Lett. 91, 021114 (2007).

(Continued)

*Primary Examiner* — Thomas T Pham
(74) *Attorney, Agent, or Firm* — Spruson & Ferguson (Hong Kong) Limited

(57) ABSTRACT

The present disclosure relates to a method for growing III-V compound semiconductors on silicon-on-insulators. Starting from {111}-oriented Si seed surfaces between a buried oxide layer and a patterned mask layer, the III-V compound semiconductor is grown within lateral trenches by metal organic chemical vapor deposition such that the non-defective portion of the III-V compound semiconductor formed on the buried oxide layer is substantially free of crystalline defects and has high crystalline quality.

14 Claims, 14 Drawing Sheets

(56) References Cited

U.S. PATENT DOCUMENTS

| | | | |
|---|---|---|---|
| 9,917,179 | B2 | 3/2018 | Balakrishnan et al. |
| 2006/0024981 | A1* | 2/2006 | Nakamura ........ H01L 21/02667 |
| | | | 438/795 |
| 2009/0039361 | A1 | 2/2009 | Li et al. |
| 2012/0032234 | A1* | 2/2012 | Wang ................ H01L 21/02546 |
| | | | 257/E29.081 |
| 2015/0048422 | A1 | 2/2015 | Bruce et al. |
| 2015/0079766 | A1 | 3/2015 | Baron et al. |
| 2019/0109003 | A1* | 4/2019 | Borg ................ H01L 21/02645 |

OTHER PUBLICATIONS

J. G. Fiorenz et al., "Aspect ratio trapping: a unique technology for integrating Ge and III-Vs with silicon CMOS" ECS Transactions 33, 963 (2010).

J. Z. Li et al., "Defect reduction of GaAs/Si epitaxy by aspect ratio trapping" J. Appl. Phys. 103, 106102 (2008).

J. Z. Li et al., "Thin film InP epitaxy on Si (001) using selective aspect ratio trapping" ECS Trans., 18, 887(2009).

W. Guo et al., "Selective metal-organic chemical vapor deposition growth of high quality GaAs on Si (001)" Appl. Phys. Lett. 105, 062101 (2014).

M. Paladugu et al., "Site selective integration of III-V materials on Si for nanoscale logic and photonic devices" Cryst. Growth Des., 12, 4696 (2012).

C. Merckling et al., "Heteroepitaxy of InP on Si(001) by selective-area metal organic vapor-phase epitaxy in sub-50 nm width trenches: The role of the nucleation layer and the recess engineering", J. Appl.Phys. 115, 023710 (2014).

H. Kataria et al., "Towards a monolithically integrated III-V laser on silicon: optimization of multi-quantum well growth on InP on Si" Semicond. Sci. Technol. 28 094008 (2013).

S. Li et al. "Ridge InGaAs/InP multi-quantum-well selective growth in nanoscale trenches on Si (001) substrate" Applied Physics Letters 108, No. 2: 021902 (2016).

B. Kunert et al., "III/V nano ridge structures for optical applications on patterned 300 mm silicon substrate" Applied Physics Letters 109, No. 9: 091101 (2016).

L. Megalini et al., "1550-nm InGaAsP multi-quantum-well structures selectively grown on v-groove-patterned SOI substrates" Applied Physics Letters 111, No. 3: 032105 (2017).

S. Wirths et al., "Room-temperature lasing from monolithically integrated GaAs microdisks on silicon" ACS nano 12, No. 3: 2169-2175 (2018).

Yu Han, Ying Xue, and Kei May Lau, "Selective lateral epitaxy of dislocation-free InP on silicon-on-insulator", Applied Physics Letters , vol. 114, No. 19, p. 192105, 2019.

* cited by examiner

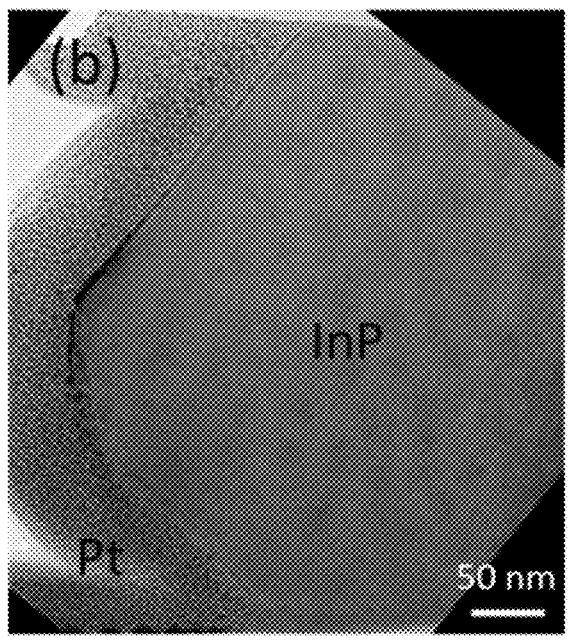 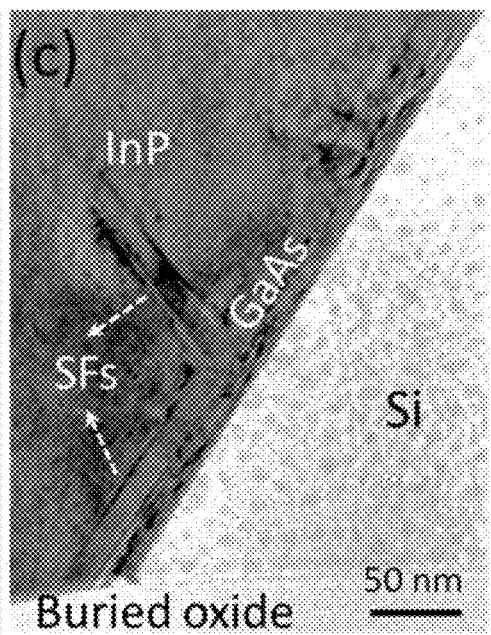
Fig. 12B    Fig. 12C
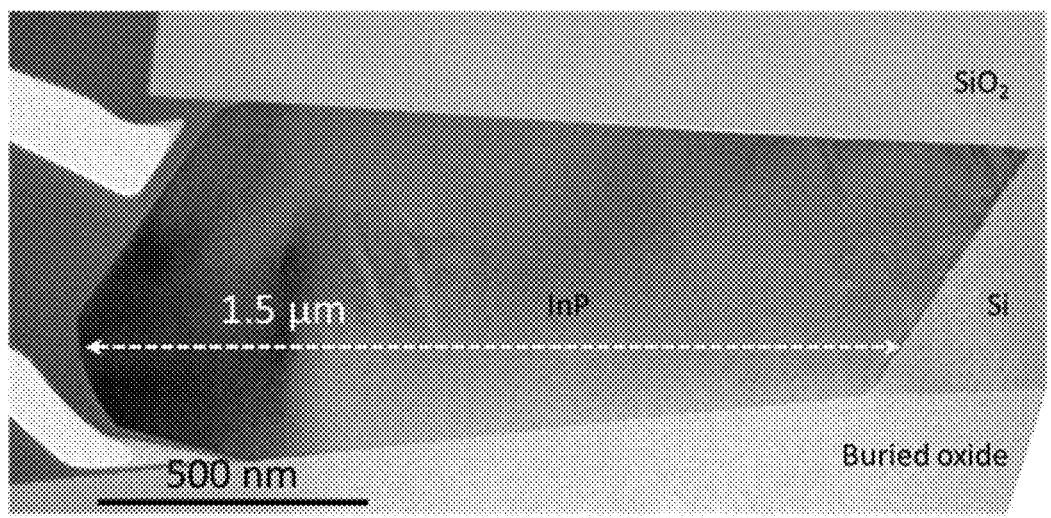
Fig. 12D

METHOD FOR GROWING III-V COMPOUND SEMICONDUCTOR THIN FILMS ON SILICON-ON-INSULATORS

PRIOR DISCLOSURE BY THE INVENTOR OR A JOINT INVENTOR

Part of the present invention was disclosed in a paper published in the Applied Physics Letters (DOI: 10.1063/1.5095457) on 17 May 2019. The paper is a grace period inventor-originated disclosure disclosed within one year before the effective filing date of this application.

TECHNICAL FIELD

The present disclosure relates to a method for growing III-V compound semiconductors on silicon-on-insulators and a semiconductor structure comprising the III-V compound semiconductors grown by the method.

BACKGROUND

Integration of III-V alloys onto Si-based optoelectronic platform can greatly benefit current integrated circuits in terms of functionality, density, speed and power consumption, and still enjoy the economy and scale offered by the Si foundries. Compared to the hybrid integration using wafer/die bonding, the monolithic integration using epitaxial III-V alloys on Si is more compatible with the current high-volume and low-cost manufacturing processes.

Over the years, several schemes have been developed to directly grow III-V materials on industry-standard (001)-oriented Si wafers. The key is how to engineer the generation and propagation of crystalline defects from lattice, thermal and polarity mismatches, so the region where optoelectronic devices reside is free of crystalline imperfections. Equipped with dislocation filters and thermal cycle annealing, blanket epitaxial III-V thin films on Si have exhibited promising results, with a dislocation density in the order of $10^6$ $cm^{-2}$ for GaAs on Si and $10^8$ $cm^{-2}$ for InP on Si. However, the several micron-thick buffer layer prohibits the interconnection of III-V devices atop the wafers and Si-based devices processed at the bottom Si substrate. Besides, a lower dislocation density is also desired for longer lifetime of the optoelectronic devices/systems.

Selective area growth of III-V materials on patterned Si substrates confines the generated crystalline defects at the III-V/Si interface and thus renders bufferless and dislocation-free III-V nano-structures. The aspect ratio trapping (ART) technique, in particular, has produced various high quality III-V nano-ridges inside nano-scale trenches confined by oxide spacers. The template assisted selective epitaxy has also resulted in some exiting demonstrations with III-V nanowires and micro-disks directly grown inside pre-patterned oxide templates. However, these growth techniques often produce nano-scale III-V alloys on bulk Si wafers. Practical applications, especially in Si photonics, necessitate III-V materials with larger volume and variety directly grown on (001)-oriented SOI platforms.

A need therefore exists for an improved method for growing III-V materials on SOI platforms that eliminates or at least diminishes the disadvantages and problems described above.

SUMMARY

Provided herein is a method for forming a region of a III-V compound semiconductor on a buried oxide layer comprising: providing a layered substrate comprising a silicon (Si) device layer, the buried oxide layer, and a patterned mask layer, the Si device layer being sandwiched between the buried oxide layer and the patterned mask layer, the patterned mask layer comprising one or more vertical trenches formed in the patterned mask layer and located on the Si device layer such that one or more exposed Si surfaces are formed on the Si device layer; starting from each exposed Si surface, etching the Si device layer laterally thereby forming one or more lateral trenches between the buried oxide layer and the patterned mask layer; etching each lateral Si surface of each lateral trench by anisotropic wet etching thereby forming one or more {111}-oriented Si seed surfaces between the buried oxide layer and the patterned mask layer; and starting from each {111}-oriented Si seed surface, growing an epitaxial layer of the III-V compound semiconductor laterally within its respective lateral trench by metal organic chemical vapor deposition thereby forming one or more epitaxial layers between the buried oxide layer and the patterned mask layer such that each epitaxial layer has a non-defective portion and a defective portion, the defective portion being sandwiched between the {111}-oriented Si seed surface and the non-defective portion, the non-defective portion forming the region of the III-V compound semiconductor on the buried oxide layer.

In certain embodiments, the defective portion has a width between 1.3d and 1.5d, d being a thickness of the Si device layer.

In certain embodiments, the III-V compound semiconductor is indium phosphide (InP), gallium arsenide (GaAs), gallium antimonide (GaSb), Indium arsenide (InAs), a ternary alloy thereof, or a quaternary alloy thereof.

In certain embodiments, the Si device layer is (001)-oriented, (111)-oriented or (110)-oriented and has a thickness between 1 nm and 1000 nm.

In certain embodiments, the buried oxide layer comprises $SiO_2$ layer and has a thickness between 1 nm and 2000 nm.

In certain embodiments, the patterned mask layer comprises $SiO_2$, SiN or $Al_2O_3$; and each vertical trench has a width between 1 nm and 100 μm.

In certain embodiments, the patterned mask layer is a patterned top oxide layer having a thickness between 1 nm and 1000 nm.

In certain embodiments, the anisotropic wet etching comprises potassium hydroxide (KOH) or tetramethylammonium hydroxide (TMAH).

In certain embodiments, the step of growing the one or more epitaxial layers comprises: starting from each {111}-oriented Si seed surface, growing a nucleation layer of the III-V compound semiconductor laterally within its respective lateral trench at a first growth temperature; and starting from each nucleation layer, growing a main layer of the III-V compound semiconductor laterally within its respective lateral trench at a second growth temperature such that each epitaxial layer comprises the nucleation layer and the main layer, the nucleation layer being sandwiched between the {111}-oriented Si seed surface and the main layer.

In certain embodiments, the first growth temperature is between 350° C. and 450° C.; and the second growth temperature is between 450° C. and 750° C.

In certain embodiments, the method further comprises: removing the patterned mask layer after the step of growing the one or more epitaxial layers; and removing the defective portion of each epitaxial layer.

In certain embodiments, the layered substrate is prepared by the steps of: providing a silicon-on-insulator (SOI) substrate comprising the Si device layer, the buried oxide layer and a Si handle layer, the buried oxide layer being sandwiched by the Si device layer and the Si handle layer; oxidizing a top surface of the Si device layer thereby forming an mask layer on the Si device layer; and patterning and etching the mask layer thereby forming the patterned mask layer.

Provided herein is a method for growing a region of a III-V compound semiconductor on a buried oxide layer comprising: providing a layered substrate comprising a Si device layer, the buried oxide layer, and a patterned mask layer, the Si device layer being sandwiched between the buried oxide layer and the patterned mask layer, the patterned mask layer comprising one or more vertical trenches formed in the patterned mask layer and located on the Si device layer such that one or more exposed Si surfaces are formed on the Si device layer; starting from each exposed Si surface, etching the Si device layer laterally thereby forming one or more lateral trenches between the buried oxide layer and the patterned mask layer; etching each lateral Si surface of each lateral trench by anisotropic wet etching thereby forming one or more {111}-oriented Si seed surfaces between the buried oxide layer and the patterned mask layer; growing a wetting layer laterally on each lateral Si surface by first metal organic chemical vapor deposition; and starting from each wetting layer, growing an epitaxial layer of the III-V compound semiconductor laterally within its respective lateral trench by second metal organic chemical vapor deposition thereby forming one or more epitaxial layers between the buried oxide layer and the patterned mask layer such that each epitaxial layer has a non-defective portion and a defective portion, the defective portion being sandwiched between the {111}-oriented Si surface and the non-defective portion, the non-defective portion forming the region of the III-V compound semiconductor on the buried oxide layer.

In certain embodiments, the wetting layer comprises GaAs, gallium phosphide (GaP) or InAs and has a width between 1 and 50 nm.

In certain embodiments, the step of growing the one or more epitaxial layers comprises: starting from each wetting layer, growing a nucleation layer of the III-V compound semiconductor laterally within its respective lateral trench at a first growth temperature; and starting from each nucleation layer, growing a main layer of the III-V compound semiconductor laterally within its respective lateral trench at a second growth temperature such that each epitaxial layer comprises the nucleation layer and the main layer, the nucleation layer being sandwiched between the wetting layer and the main layer.

In certain embodiments, the method further comprises: removing the patterned mask layer after the step of growing the one or more epitaxial layers; and removing the one or more wetting layers and the defective portion of each epitaxial layer.

Provided herein is a semiconductor device comprising: a buried oxide layer; and a semiconductor structure comprising a region of a III-V compound semiconductor on the buried oxide layer, the region of the III-V compound semiconductor being formed by the method described above.

In certain embodiments, the semiconductor structure is a layer, a ridge, a film, a light emitter, a quantum wire, a quantum well, or a quantum dot.

Provided herein is an optoelectronic device comprising: a buried oxide layer; one or more silicon waveguides located on the buried oxide layer; and one or more III-V light emitters located on the buried oxide layer; wherein each III-V light emitter comprises a region of a III-V compound semiconductor on the buried oxide layer, the region of the III-V compound semiconductor being prepared by the method described above; and wherein each III-V light emitter is in-plane and coupled with its respective silicon waveguide.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects of the present invention are disclosed as illustrated by the embodiments hereinafter.

BRIEF DESCRIPTION OF DRAWINGS

The appended drawings, where like reference numerals refer to identical or functionally similar elements, contain figures of certain embodiments to further illustrate and clarify the above and other aspects, advantages and features of the present invention. It will be appreciated that these drawings depict embodiments of the invention and are not intended to limit its scope. The invention will be described and explained with additional specificity and detail through the use of the accompanying drawings in which:

FIG. 12B is a zoomed-in TEM image of the TD-free InP region;

FIG. 12C is a close-up TEM image of the III-V/Si interface;

FIG. 12D is a cross-sectional TEM image of micron-sized InP crystals grown on a SOI;

Skilled artisans will appreciate that elements in the figures are illustrated for simplicity and clarity and have not necessarily been depicted to scale.

DETAILED DESCRIPTION OF THE INVENTION

The term "defective portion" as used herein refers to a region containing crystalline defects. The crystalline defects may include threading dislocations or planar defects. The defect density in the defective portion gradually reduces as the III-V compound semiconductor grows away from the III-V/Si interface. However, it is to be appreciated that embodiments of the present disclosure are not necessarily so limited, and that certain aspects of the embodiments may be applicable to larger, and smaller scales.

The term "non-defective portion" as used herein refers to a region being free or substantially free of threading dislocations, or a region containing crystalline defects in a very limited amount (e.g., below $10^6$ cm$^{-2}$). However, it is to be appreciated that embodiments of the present disclosure are not necessarily so limited, and that certain aspects of the embodiments may be applicable to larger, and smaller scales.

It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

The present disclosure describes the selective lateral growth of in-plane, bufferless and dislocation-free III-V semiconductors on pre-patterned SOI wafers. The lateral oriented trenches can be readily fabricated in present Si-based foundries, and the epitaxy can be performed in MOCVD reactors. The {111}-oriented Si-seeds prevent the formation of anti-phase boundaries, which is commonly observed in conventional III-V thin films grown on (001) Si. The defects necking effect of the lateral trenches effectively confines the inclined crystalline defects and render dislocation-free III-V crystals right atop the buried oxide layer. The versatility of this invention is manifested in the ability to grow III-V alloys with various chemical compositions and dimensions on the industry-standard SOI wafers. These III-V crystals can also serve as virtual substrate for the growth of more complex semiconductor structures (e.g., multi-quantum wells, quantum dots and doped PN junctions). The unique in-plane configuration facilitates the direct integration of III-V devices with the Si-based optoelectronic devices on a common SOI platform.

Figure 1:
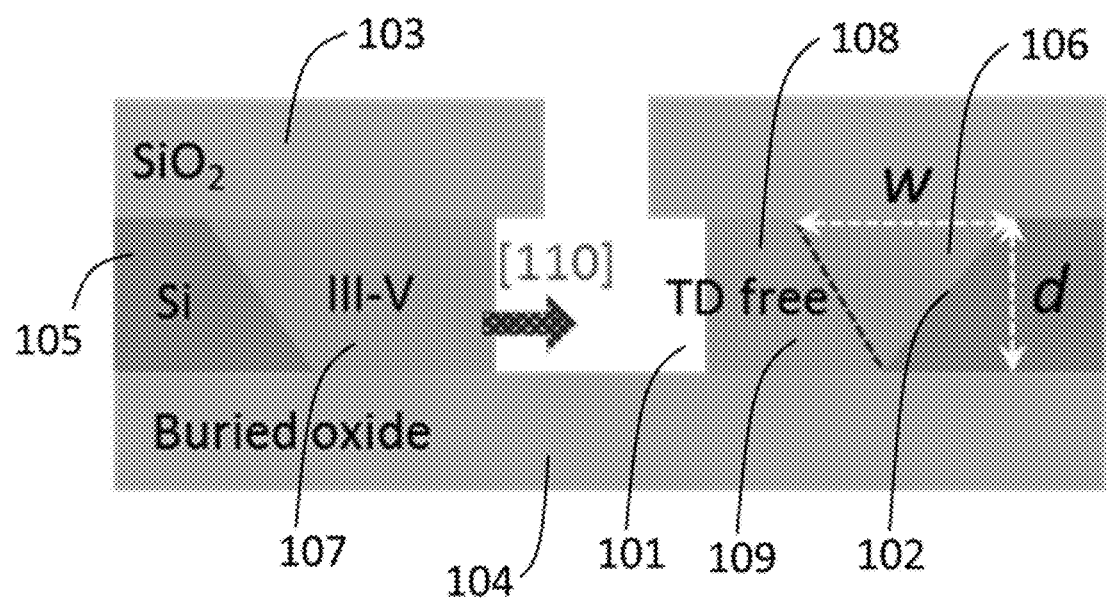
FIG. 1 is a schematic diagram illustrating the defect trapping and growth mechanism of a III-V compound semiconductor on a buried oxide layer according to certain embodiments.

FIG. 1 depicts the defect trapping and growth mechanism of III-V nano/micro structures on (001)-oriented silicon-on-insulators according to certain embodiments. Nano-scale lateral trenches 101 are engineered in a way that {111}-oriented Si seed surfaces 102 locate at both sides of the lateral trench 101 and are sandwiched between a patterned mask layer 103 and a buried oxide layer 104. As both of the patterned mask layer 103 and the buried oxide layer 104 are amorphous, they can serve as a growth mask. III-V/Si hetero-epitaxy is initiated at the exposed {111}-oriented Si seed surfaces 102 that would not lead to the formation of antiphase boundaries (APBs). In this embodiment, the present growth features a horizontal growth front along the [110] direction. Given a Si device layer 105 having a thickness of d, the width of the defective III-V layer 106 is w=1.4d as shown in FIG. 1. The dimension of III-V nano-ridges 107 grown by the present method hinges on the thickness of the Si device layer 105 which can be precisely controlled down to a few nanometer. The atomic sharp surface of the oxide sidewalls of the patterned mask layer 103 and the buried oxide layer 104 precludes the formation of any unwanted planar defects. The defective III-V layer 106 resides at one side of the TD-free-region 108 and can be readily etched away, rendering TD-free III-V layer 109 in contact with the buried oxide layer 104 and close to the Si device layer 105.

In certain embodiments, the in-plane and close placement of the TD-free III-V layer with the Si device layer also facilitates the integration of III-V light emitters with Si-based photonic components. Besides, the refractive index contrast between the epitaxial III-V and the buried oxide brings on strong mode confinement and could enable III-V light emitters with ultra-small footprint. Additionally, the flexible undercut of Si device layer and possible coalescence of III-V layer could produce not only III-V nano-ridges but also micro-scale III-V layers atop the buried oxide. Surprisingly, the dimension of the defective III-V layer can be significantly reduced by decreasing the thickness of the Si device layer. III-V crystals can then be formed via the coalescence of lateral nano-ridges and the subsequent vertical growth along the [001] direction.

Figure 2:
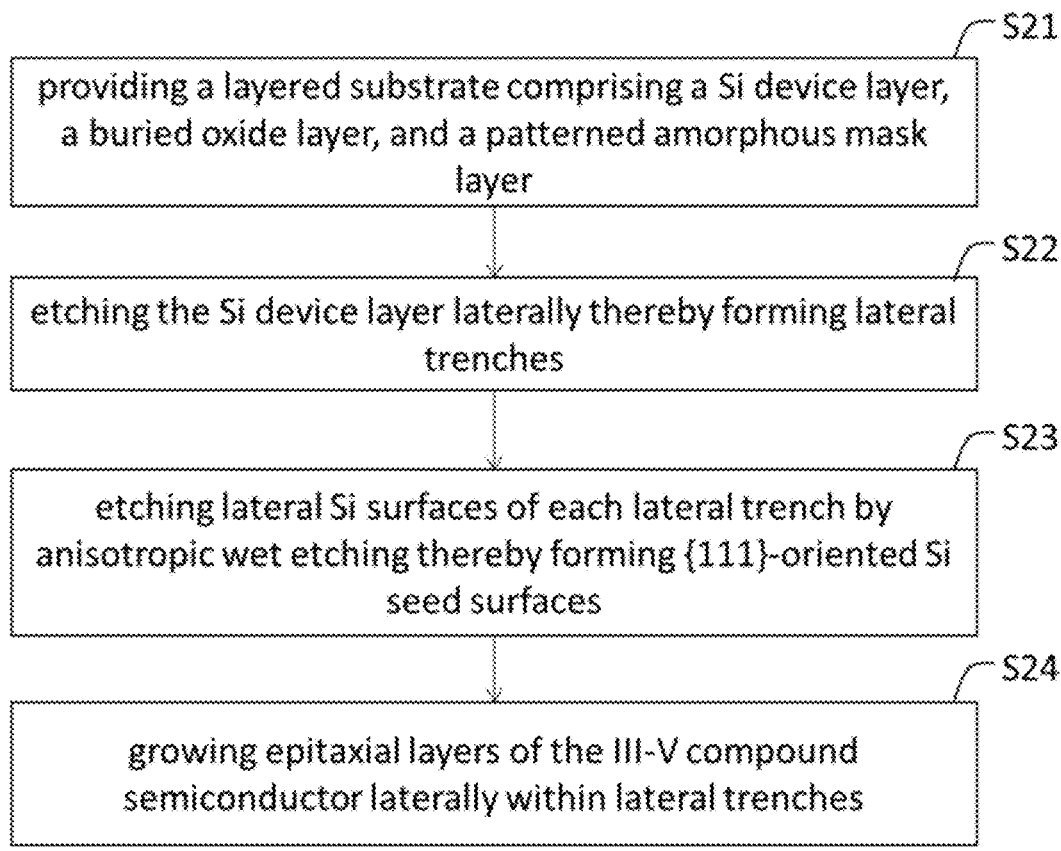
FIG. 2 is a flow chart depicting a method for forming a region of a III-V compound semiconductor on a buried oxide layer according to certain embodiments.

FIG. 2 is a flow chart depicting a method for forming a region of a III-V compound semiconductor on a buried oxide layer according to certain embodiments.

In step S21, a layered substrate comprising a Si device layer, a buried oxide layer, and a patterned mask layer is provided. The Si device layer is sandwiched between the buried oxide layer and the patterned mask layer. The patterned mask layer comprises vertical trenches formed in the patterned mask layer and located on the Si device layer such that exposed Si surfaces are formed on the Si device layer.

In step S22, starting from the exposed Si surfaces, the Si device layer is laterally etched by wet etching or dry etching thereby forming lateral trenches between the buried oxide layer and the patterned mask layer.

In step S23, lateral Si surfaces of each lateral trench are etched by anisotropic wet etching thereby forming {111}-oriented Si seed surfaces between the buried oxide layer and the patterned mask layer.

In step S24, starting from the {111}-oriented Si seed surfaces, epitaxial layers of the III-V compound semiconductor are laterally grown within each lateral trench by metal organic chemical vapor deposition using growth precursors of the III-V compound semiconductor thereby forming the epitaxial layers between the patterned mask layer and the buried oxide layer such that each epitaxial layer has a non-defective portion and a defective portion. The defective portion is sandwiched between the {111}-oriented Si surface and the non-defective portion. The non-defective portion forms the region of the III-V compound semiconductor on the buried oxide layer such that the region of the III-V compound semiconductor is substantially free of crystalline defects and has high crystalline quality.

Figure 3A:
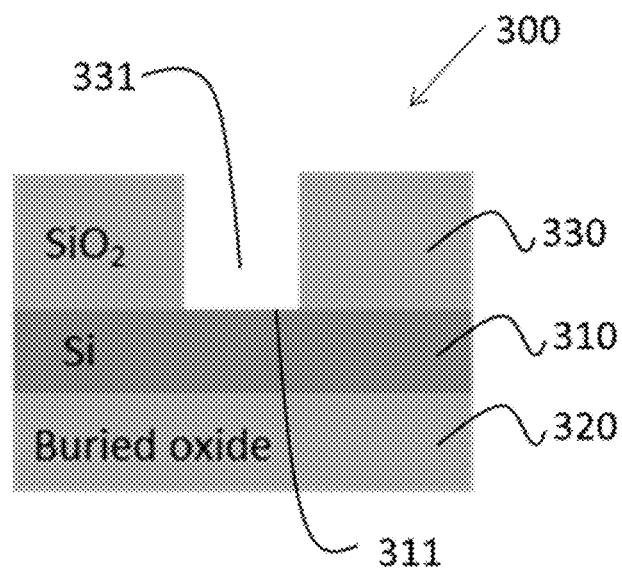
FIG. 3A is schematic diagram depicting a layered substrate according to certain embodiments.
Figure 3B:
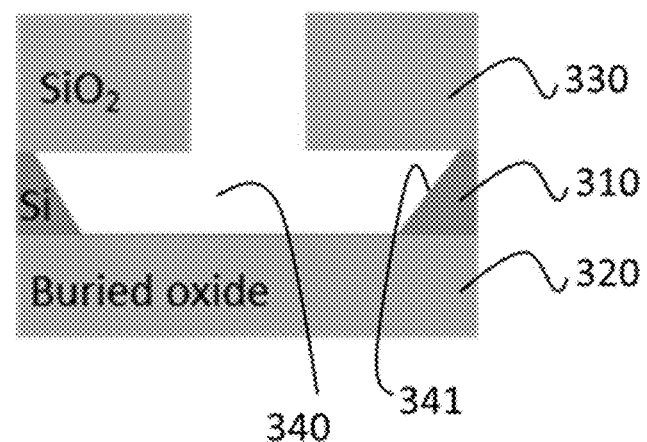
FIG. 3B is schematic diagram depicting the formation of a lateral trench according to certain embodiments.
Figure 3C:
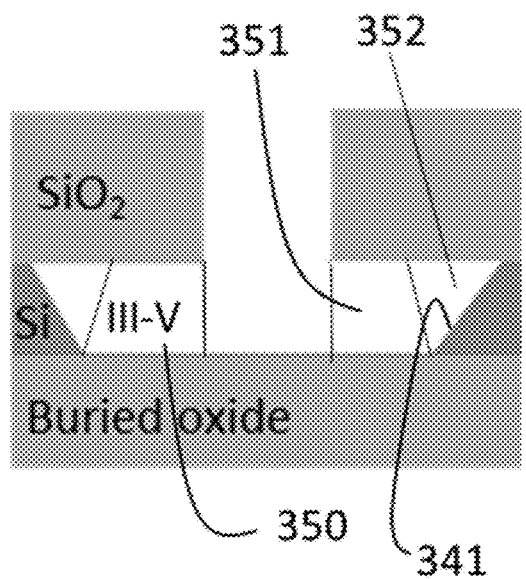
FIG. 3C is schematic diagram depicting the growth of an epitaxial layer of a III-V compound semiconductor according to certain embodiments.

FIGS. 3A-3C are schematic diagrams depicting a method for forming a III-V region on a buried oxide layer according to certain embodiments.

As shown in FIG. 3A, a layered substrate 300 comprising a Si device layer 310, a buried oxide layer 320, and a patterned mask layer 330 is provided. The Si device layer 310 is sandwiched between the buried oxide layer 320 and the patterned mask layer 330. The patterned mask layer 330 comprises a vertical trench 331 formed in the patterned mask layer 330 and located on the Si device layer 310 such that an exposed Si surface 311 is formed on the Si device layer 310.

As shown in FIG. 3B, starting from the exposed Si surface 311, the Si device layer 310 is laterally etched by anisotropic wet etching thereby forming a lateral trench 340 sandwiched between the buried oxide layer 320 and the patterned mask layer 330 and having {111}-oriented Si seed surfaces 341 at both lateral sides.

As shown in FIG. 3C, starting from the {111}-oriented Si seed surfaces 341, epitaxial III-V layers 350 are laterally grown within the lateral trench 340 by metal organic chemical vapor deposition thereby forming the epitaxial III-V layers 350 between the buried oxide layer 320 and the patterned mask layer 330 such that each epitaxial III-V layer 350 has a non-defective portion 351 and a defective portion 352. The defective portion 352 is sandwiched between the {111}-oriented Si seed surface 341 and the non-defective portion 351. The non-defective portion 351 forms the III-V region on the buried oxide layer 320 such that the III-V region is substantially free of crystalline defects and has high crystalline quality.

In certain embodiments, the defective portion has a width between 1.3d and 1.5d, where d is a thickness of the Si device layer.

In certain embodiments, the III-V compound semiconductor is InP, GaAs, GaSb, InAs, a ternary alloy thereof, or a quaternary alloy thereof.

In certain embodiments, the Si device layer is (001)-oriented, (111)-oriented or (110)-oriented. In certain embodiments, the Si device layer has a thickness between 1 nm and 1000 nm.

In certain embodiments, the buried oxide layer comprises $SiO_2$. In certain embodiments, the buried oxide layer has a thickness between 1 nm and 2000 nm.

In certain embodiments, the patterned mask layer comprises an amorphous material.

In certain embodiments, the patterned mask layer comprises $SiO_2$, SiN or $Al_2O_3$.

In certain embodiments, the patterned mask layer is a patterned top oxide layer.

In certain embodiments, the patterned top oxide layer comprises $SiO_2$ or $Al_2O_3$. In certain embodiments, the patterned top oxide layer has a thickness between 1 nm and 1000 nm.

In certain embodiments, each vertical trench has a width between 1 nm and 100 μm.

In certain embodiments, the anisotropic wet etching comprises potassium hydroxide (KOH) or tetramethylammonium hydroxide (TMAH).

In certain embodiments, the step of etching the Si device layer laterally comprises wet etching, which also creates the {111}-oriented Si seed surfaces for subsequent III-V heteroepitaxy. The wet etching can include KOH or TMAH.

In certain embodiments, the step of etching the Si device layer laterally comprises dry etching, which provides a faster etching rate and higher selectivity between Si and $SiO_2$. The dry etching can be reactive ion etching or inductively coupled plasma etching.

In certain embodiments, the MOCVD comprises a V/III ratio between 1 and 1000, reactor pressure between 20 mbar and 1000 mbar and a growth temperature between 350° C. and 750° C.

In certain embodiments, the step of growing the epitaxial layers comprises: starting from each {111}-oriented Si seed surface, growing a nucleation layer of the III-V compound semiconductor laterally within its respective lateral trench at a first growth temperature; and starting from each nucleation layer, growing a main layer of the III-V compound semiconductor laterally within its respective lateral trench at a second growth temperature such that each epitaxial layer comprises the nucleation layer and the main layer, the nucleation layer being sandwiched between the {111}-oriented Si seed surface and the main layer.

In certain embodiments, the first growth temperature is between 350° C. and 450° C.; and the second growth temperature is between 450° C. and 750° C.

In certain embodiments, the method further comprises: removing the patterned mask layer after the step of growing epitaxial layers; and removing the defective portion of each epitaxial layer. The defective portion can be removed by wet etching or dry etching.

In certain embodiments, the layered substrate is prepared by the steps of: providing a silicon-on-insulator (SOI) substrate comprising the Si device layer, the buried oxide layer and a Si handle layer, the buried oxide layer being sandwiched by the Si device layer and the Si handle layer; oxidizing a surface of the Si device layer thereby forming a top oxide layer on the Si device layer; and patterning and etching the top oxide layer thereby forming the patterned top oxide layer.

In certain embodiments, the method further comprises: growing a wetting layer laterally on each lateral Si surface by first metal organic chemical vapor deposition: and starting from each wetting layer, growing an epitaxial layer of the III-V compound semiconductor laterally within its respective lateral trench by second metal organic chemical vapor deposition.

In certain embodiments, the wetting layer comprises GaAs, GaP or InAs. In certain embodiments, the wetting layer has a width between 1 and 50 nm.

In certain embodiments, the method further comprises: removing the patterned mask layer after the step of growing epitaxial layers; and removing the wetting layer and the defective portion of each epitaxial layer. The wetting layer and the defective portion can be removed by wet etching or dry etching.

Figure 4A:
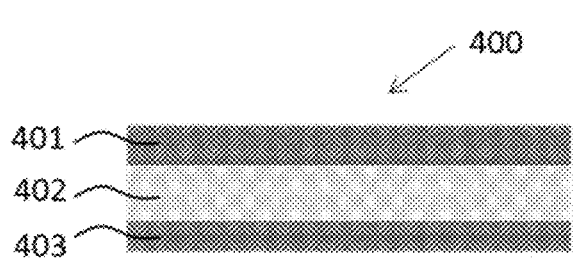
FIG. 4A is a schematic diagram depicting a SOI wafer according to certain embodiments.
Figure 4B:
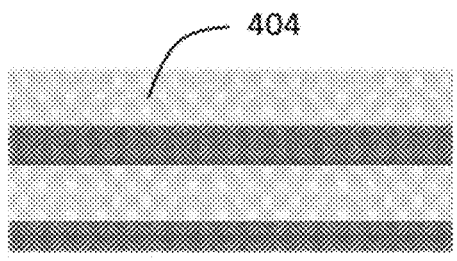
FIG. 4B is a schematic diagram depicting the formation of a top oxide layer according to certain embodiments.
Figure 4C:
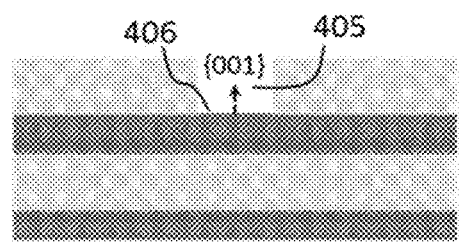
FIG. 4C is a schematic diagram depicting the formation of a vertical trench in the top oxide layer according to certain embodiments.
Figure 4D:
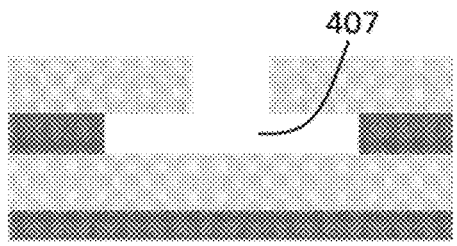
FIG. 4D is a schematic diagram depicting the formation of a lateral trench by dry etching according to certain embodiments.

FIGS. 4A-4F show the schematics of the fabrication process of a patterned (001) SOI wafer according to certain embodiments. FIG. 4A shows a SOI wafer 400 with a Si device layer 401, a $SiO_2$ layer 402 and a Si handle layer 403. The $SiO_2$ layer 402 is sandwiched between the Si device layer 401 and the Si handle layer 403. After the deposition of a top oxide layer 404 (e.g., an amorphous $SiO_2$ layer) either by thermal oxidation or chemical vapor deposition (see FIG. 4B), vertical trenches 405 along the [110] direction are patterned atop the SOI wafer 400 (see FIG. 4C). The exposed Si surface 406 features a [001] orientation. Afterwards, selective dry etching process is performed to undercut the Si device layer 401 to create lateral trenches 407 in the lateral direction (see FIG. 4D). Finally, selective wet etching is conducted to induce {111}-oriented Si surfaces 408 (see FIG. 4E).

Figure 4E:
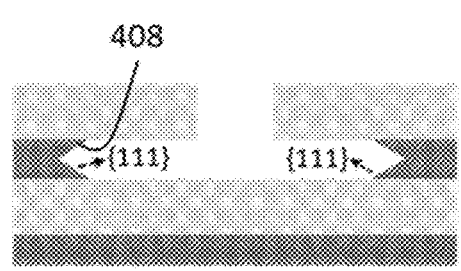
FIG. 4E is a schematic diagram depicting the formation of {111}-oriented Si surfaces by wet etching according to certain embodiments.
Figure 4F:
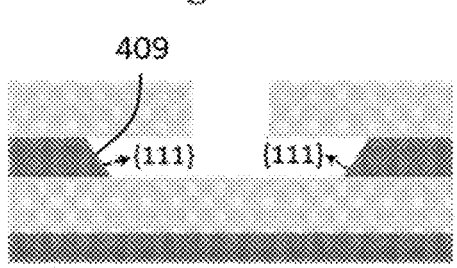
FIG. 4F is a schematic diagram depicting the formation of a lateral trench and {111}-oriented Si surfaces by wet etching according to certain embodiments.

Alternatively, after the formation of the vertical trenches 405 (See FIG. 4C), wet etching process is performed to undercut the Si device layer 401 to create lateral trenches 407 in the lateral direction as well as induce {111}-oriented Si surfaces 409 as shown in FIG. 4F. Depending on the selected wet etching solutions, {111} facets with different configurations can be formed, as shown in FIGS. 4E and 4F.

Figure 5A:
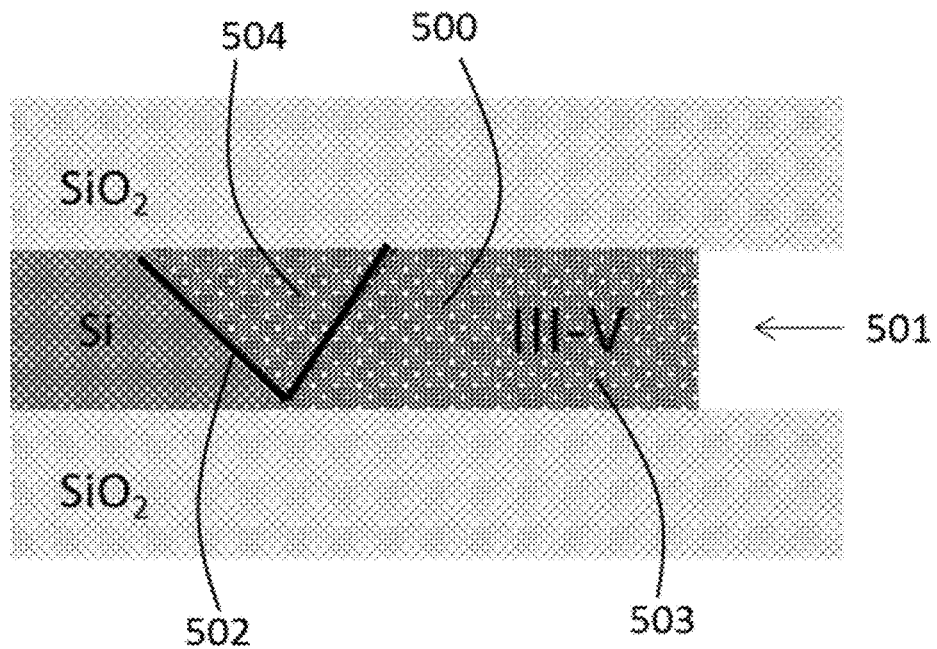
FIG. 5A is a schematic diagram depicting selective lateral growth of III-V semiconductors inside the created lateral trenches by MOCVD according to certain embodiments.
Figure 5B:
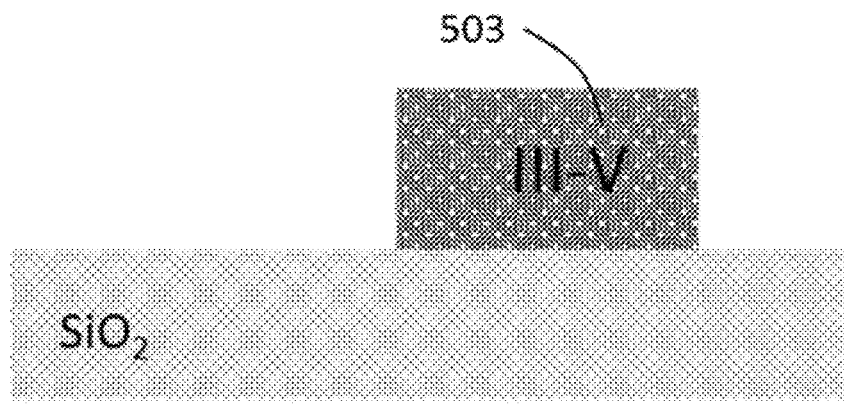
FIG. 5B is a schematic diagram depicting the removal of the defective III-V buffer according to certain embodiments.

FIG. 5A shows the selective lateral growth of III-V semiconductors 500 inside the created lateral trenches 501 by MOCVD according to certain embodiments. The {111}-oriented Si seed surface 502 with double atomic steps inhibits the formation of anti-phase boundaries. This epitaxial III-V features a lateral growth direction along the [110] direction. Defects generated due to lattice mismatch such as planar disorders and threading dislocations (TD) are either trapped right at the III/Si interface or propagate into the epitaxial layer and terminated at the oxide layers. As a result, in-plane dislocation-free III-V crystals 503 are directly integrated onto the patterned SOI wafers. The present lateral growth allows the removal of a defective III-V buffer 504 via conventional top-down processing, as shown in FIG. 5B.

This invention is applicable to III-V alloys with various chemical compositions, e.g., GaAs, InP, InAs, or GaSb.

Figure 6A:
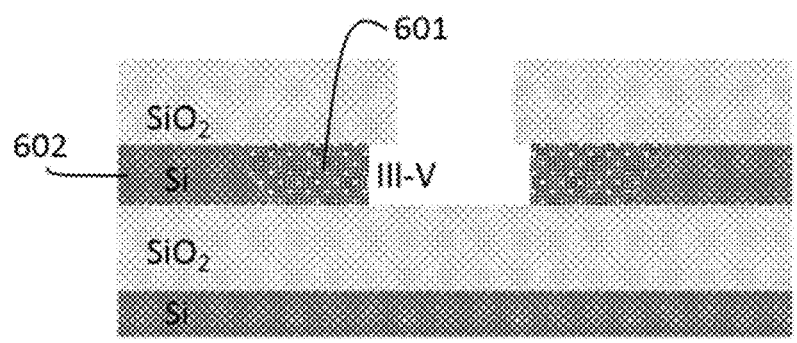
FIG. 6A is a schematic diagram depicting the epitaxy of III-V nano-crystals on a SOI wafer with a small undercut of the Si device layer according to certain embodiments.
Figure 6B:
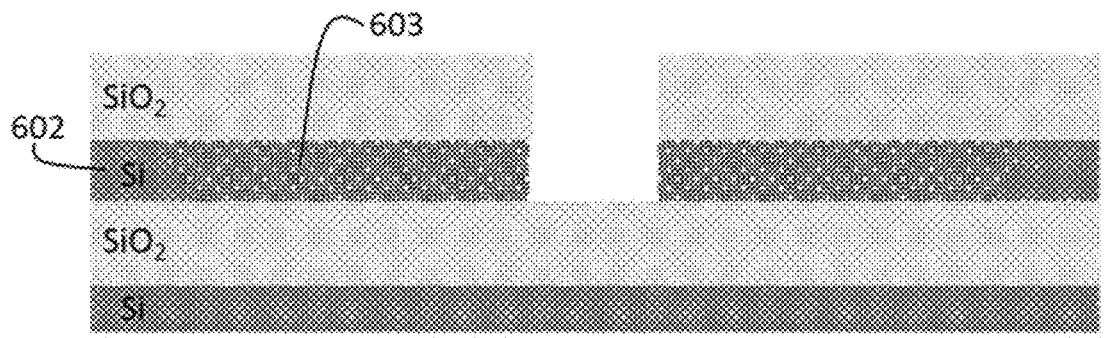
FIG. 6B is a schematic diagram depicting the epitaxy of micron-sized III-V thin films on a SOI wafer with a sufficient deep undercut of the Si device layer according to certain embodiments.

Depending on the targeted applications, this invention allows the growth of III-V materials with different dimensions in certain embodiments. FIG. 6A depicts the epitaxy of III-V nano-crystals 601 on a SOI wafer, in which a small undercut of the Si device layer 602 is required. FIG. 6B depicts the epitaxy of micron-sized III-V thin films 603 on a SOI wafer, in which a sufficient deep undercut of the Si device layer 602 up to a few micron is mandatory.

Figure 7A:
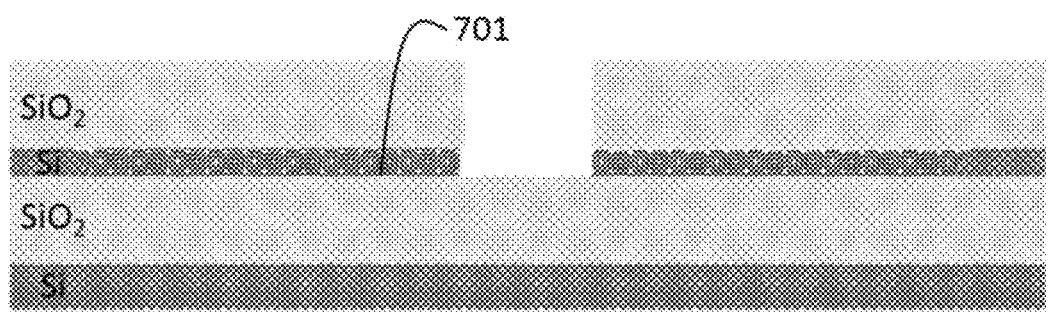
FIG. 7A is a schematic diagram depicting thin III-V thin films according to certain embodiments.
Figure 7B:
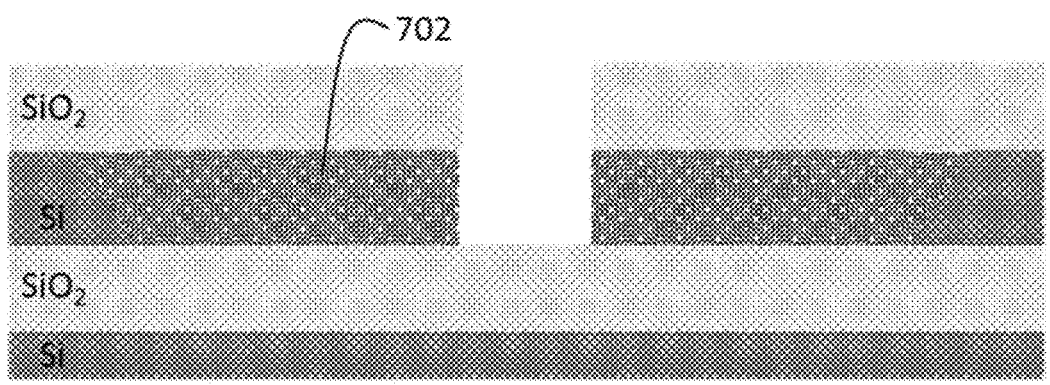
FIG. 7B is a schematic diagram depicting thick III-V thin films according to certain embodiments.

Applications in electronics require III-V thin films with a thickness down to a few tens of nanometers, while applications in photonics require III-V thin films with a thickness up to a few hundreds of nanometers. This invention can produce III-V thin films with different thicknesses ranging from a few nanometer to hundreds of nanometers depending on the thickness of the Si device layer. FIG. 7A presents a schematic of thin III-V thin films 701 (e.g., 1 nm to 200 nm) for applications in nano-electronics. FIG. 7B presents a schematic of thicker III-V thin films 702 (e.g., larger than 200 nm) for applications in nano-photonics. The thickness of the epitaxial III-V alloys hinges on the initial thickness of the Si device layer.

Figure 8A:
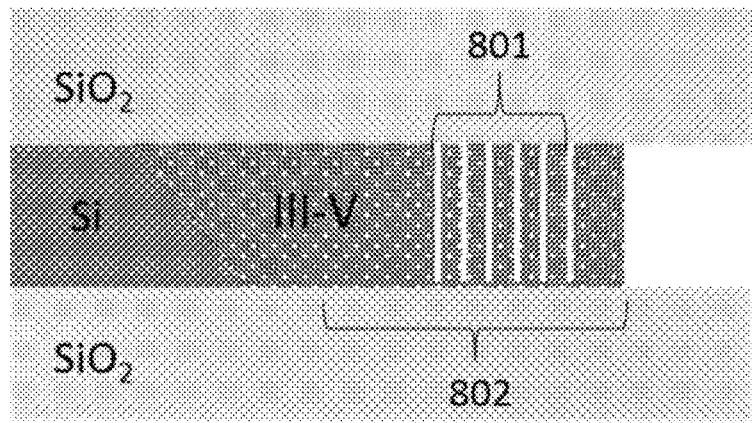
FIG. 8A is a schematic diagram depicting the lateral growth of quantum wells inside a III-V buffer layer according to certain embodiments.
Figure 8B:
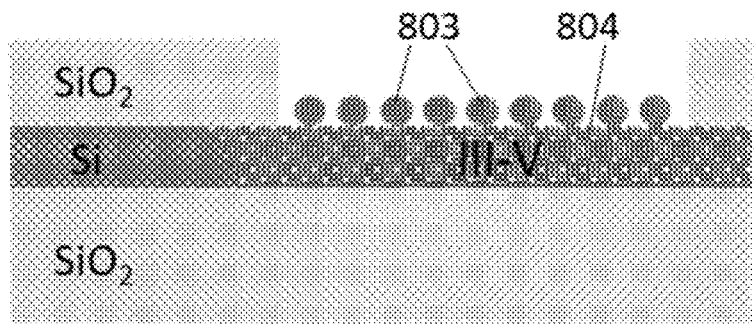
FIG. 8B is a schematic diagram depicting the vertical growth of quantum dots on an exposed (001)-oriented III-V surface according to certain embodiments.

The laterally-grown III-V crystals can also serve as virtual substrates for the subsequent growth of more complex configurations with designer-chosen structures. In certain embodiments, FIG. 8A presents the lateral growth of quantum wells 801 inside a III-V buffer layer 802, and FIG. 8B presents the vertical growth of quantum dots 803 on an exposed (001)-oriented III-V surface 804.

Figure 8C:
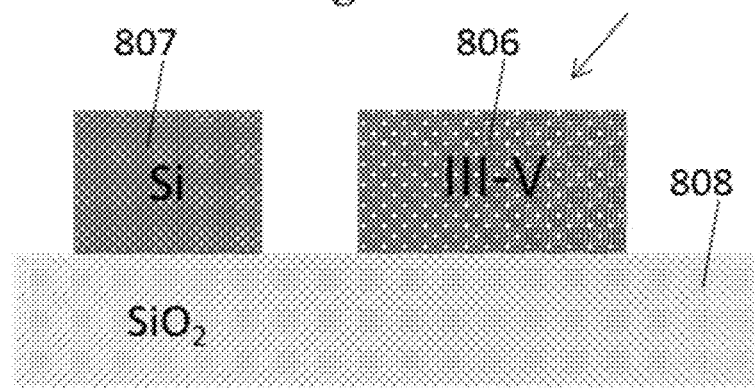
FIG. 8C is a schematic diagram depicting the direct coupling between III-V light sources and Si waveguides of a Si-photonics chip according to certain embodiments.

In certain embodiments, the direct growth of III-V on SOI wafers offers this invention one unprecedented advantage, this is, the direct coupling between III-V light sources 806 and the Si waveguides 807 of a Si-photonics chip 805 on the buried oxide layer 808, as schematically shown in FIG. 8C.

Accordingly, different semiconductor devices and semiconductor structures can be prepared by the method described above.

The present disclosure provides a semiconductor device comprising: a buried oxide layer; and a semiconductor structure comprising a region of a III-V compound semiconductor on the buried oxide layer, the region of the III-V compound semiconductor being prepared by the method described above. The semiconductor device can be an electronic device or an optoelectronic device.

In certain embodiments, the semiconductor structure is a layer, a ridge, a film, a light emitter, a quantum wire, a quantum well, or a quantum dot.

In certain embodiments, the present disclosure provides an optoelectronic device comprising: a buried oxide layer; one or more silicon waveguides located on the buried oxide layer; and one or more III-V light emitters located on the buried oxide layer. Each III-V light emitter comprises a region of a III-V compound semiconductor on the buried oxide layer. The region of the III-V compound semiconductor is prepared by the method described above. Each III-V light emitter is in-plane and coupled with its respective silicon waveguide.

Example 1

Figure 9:
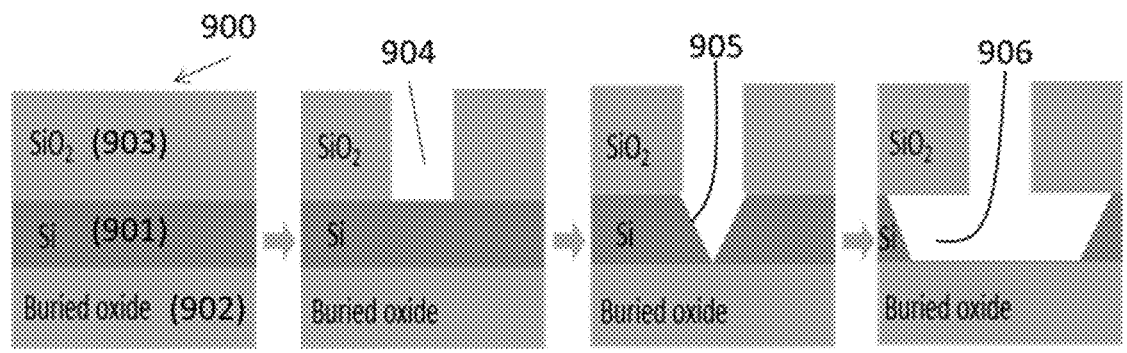
FIG. 9 is a schematic diagram depicting the preparation of a nano-patterned SOI wafer for the growth of III-V nano-ridges according to certain embodiments.

Growth of III-V nano-ridges using the present method started with the preparation of nano-patterned SOI wafers. As shown in FIG. 9, the (001)-oriented SOI wafer 900 featured a Si device layer 901 with thickness of 1.5±0.08 µm, a buried oxide layer 902 with thickness of 2.0±0.08 µm, and a Si handle layer (not shown in this figure) with thickness of 725±15 µm. The Si device layer 901 was thinned down to 600 nm using cycled oxidation/etching process, and then grew 500 nm thick $SiO_2$ layer 903 using thermal oxidation. The remaining Si device layer thus had a thickness around 350 nm. Nano-scale vertical trenches 904 with a width of 450 nm and a pitch of 2.8 µm were then patterned along the [1$\bar{1}$0] direction on the SOI wafer 900 using photolithography and following dry etching process (see FIG. 9). Next, the nano-scale vertical trenches 904 were etched into {111}-oriented V-grooves 905 using KOH based anisotropic wet etching (30% at 90° C.). Prolonged etching resulted in lateral undercut of the Si device layer and therefore, forming symmetrical lateral trenches 906 on the SOI wafer 900.

Prior to growth, the patterned SOI was dipped into diluted HF solution to remove the native oxide and then was immersed into KOH solution (45% at 70° C.) to obtain fresh {111}-oriented Si seed surfaces. Immediately after, the sample was loaded into the MOCVD system (AIXTRON 200/4) and underwent a thermal cleaning process at 800° C. in a $H_2$ ambient. Triethylgallium (TEGa), tertiarybutylarsine (TBA), trimethylindium (TMIn) and tertiarybutylphosphine (TBP) were selected as growth precursors. It was began with the deposition of a 10 nm thick low temperature (LT) GaAs wetting layer at 400° C. with a V/III ratio of 22, and continued with the growth of a LT-InP nucleation layer at 430° C. with a V/III ratio of 211. Afterwards, reactor temperature was ramped up to higher temperatures (from 630° C. to 670° C.) for the growth of high temperature (HT) InP main layer with a V/III ratio of 187.

Figure 10A:
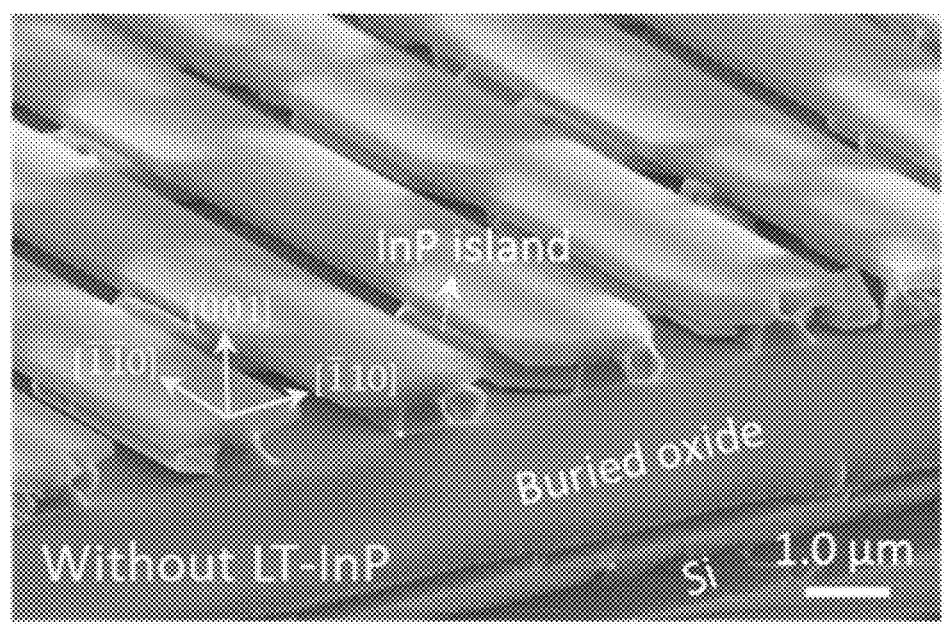
FIG. 10A is a tilted-view SEM image of InP grown without a LT-InP nucleation layer.
Figure 10B:
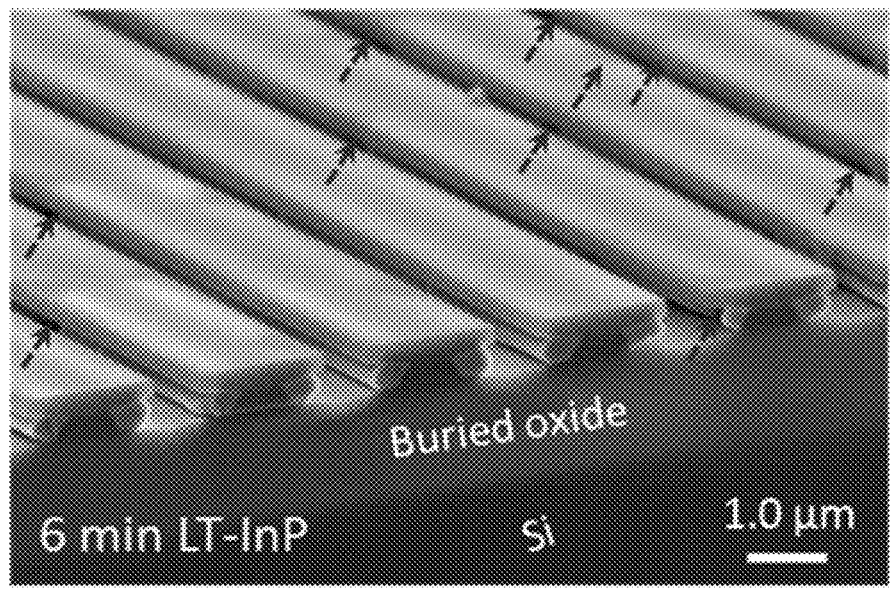
FIG. 10B is a tilted-view SEM image of InP grown at 670° C.
Figure 10C:
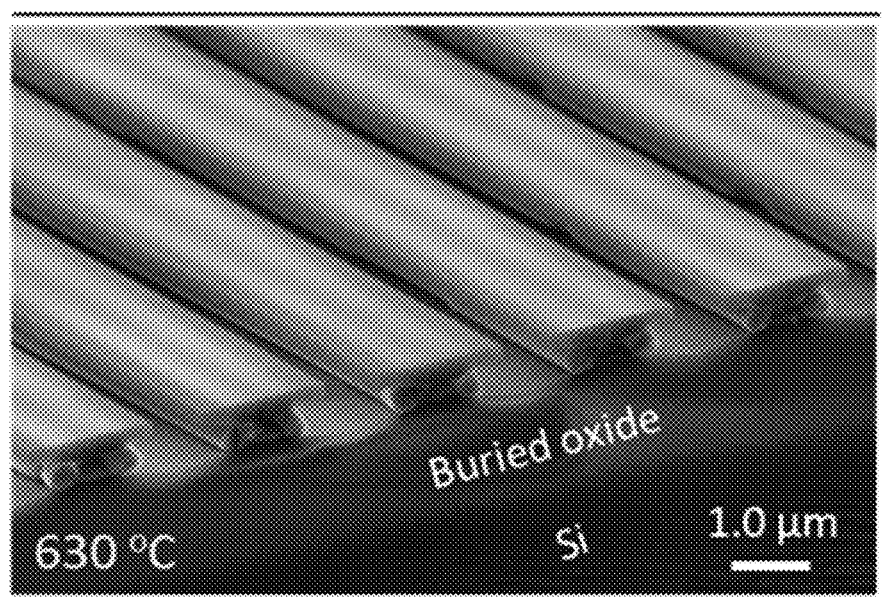
FIG. 10C is a tilted-view SEM image of InP grown at 630° C.

FIGS. 10A-10C presents scanning electron microscopy (SEM) images of lateral InP-epitaxial layer grown at different epitaxial conditions. Note that the samples were intentionally tilted on the SEM stage for better view of the lateral-epitaxiay morphology. Without the LT-InP nucleation layer, the HT-InP grown at 670° C. forms large islands and exhibits a nice faceting of the growth front, but an incomplete coverage of the Si surface as shown in FIG. 10A. The large distance between adjacent InP islands stems from the poor affinity between HT-InP and the LT-GaAs wetting layer as well as the large diffusion length of indium adatoms at high temperatures. To enable full coverage of HT-InP on the Si surface, a thin LT-InP nucleation layer is introduced between the LT-GaAs wetting layer and the HT-InP main layer. As shown by the SEM image in FIG. 10B, the growth discontinuity (distance between adjoining InP islands) reduces and some InP islands coalesce into continuous nano-ridges. However, there are still some dents on the surface of the InP-epitaxial layer due to the imperfect coalescence of InP islands during the HT-InP growth stage (see the arrows in FIG. 10B). To facilitate the coalescence of HT-InP islands, the growth temperature of HT-InP was reduced from 670° C. to 650° C. and then to 630° C. Eventually, the density and depth of the surface dents significantly decreased, as evidenced by the SEM photo in FIG. 10C. It should be pointed out that epitaxy of the HT-InP layer at lower temperatures such as 600° C. and 550° C. jeopardizes the surface morphology of the InP-epitaxial layer with the presence of dense and shallow surface dents.

Figure 11A:
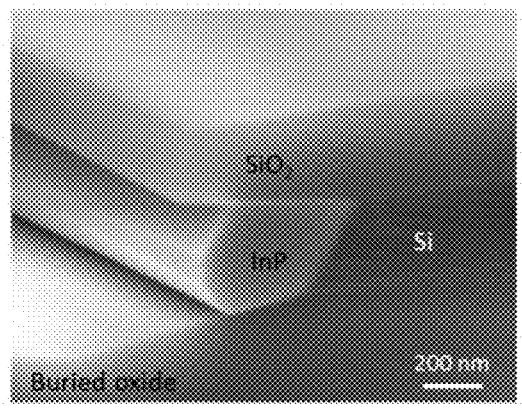
FIG. 11A is a tilted-view SEM image of one InP sandwiched between the top oxide layer and the buried oxide layer.
Figure 11B:
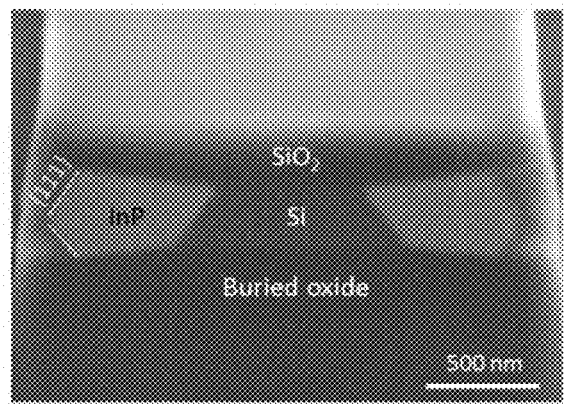
FIG. 11B is a cross-sectional SEM image of two symmetrical InP.
Figure 12A:
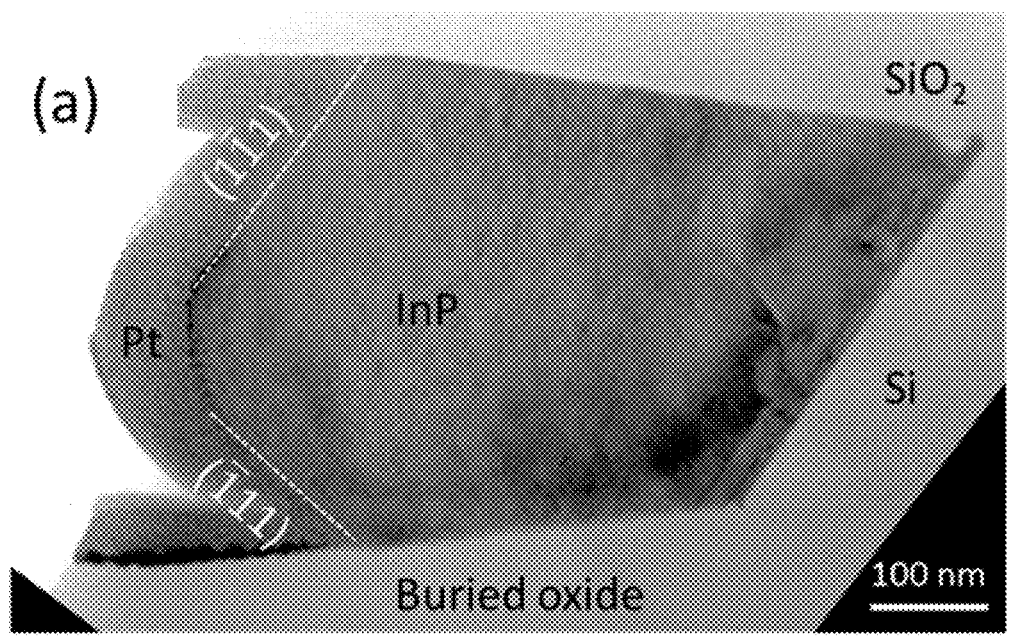
FIG. 12A is a cross-sectional TEM image of InP.

FIG. 11A shows a tilted SEM image of one InP-epitaxial "wing" grown using the present method, and FIG. 11B displays a cross-sectional SEM image of two symmetrical InP-epitaxial "wings". The Si pedestal sandwiched between the top oxide layer and the buried oxide layer features two {111}-oriented surfaces. Starting from the nucleation sites provided by the {111} Si facets, the InP crystal evolves laterally along the [110] direction into wing-structures with two {111} facets. The angle between the two {111} facets is around 110° which indicates a zincblende crystal structure. It is further confirmed the formation of zincblende InP in following transmission electron microscopy (TEM) and room temperature photoluminescence (PL) measurements. The top {1$\bar{1}$1} facet is slightly larger than the bottom {$\bar{1}$11} facet. This asymmetry is ascribed to the difference in the tilted angles between the top oxide layer and the buried oxide layer (see FIG. 11A). To investigate the defect generation and trapping mechanism of the present method, TEM lamella was prepared using focused ion beam (FEI Helios G4) and the specimen was subsequently inspected using a JEOL2010F field-emission microscope. As evidenced by the TEM photo in FIG. 12A, most of the defects are restricted at the III-V/Si interface, and the InP layer away from the interface is defect-free (see FIG. 12B). A close-up of the III-V Si interface reveals the formation of a high density of planar defects along the {1$\bar{1}$1} Si surface, and a few planar defects along the {$\bar{1}$11} direction (see FIG. 12C). There planar defects are formed to accommodate the strain induced by the lattice mismatch between III-V and Si. While planar defects along the {1$\bar{1}$1} can be confined right at the III-V/Si interface, those along the {$\bar{1}$11} direction will penetrate into the InP main layer and terminate at the top oxide layer.

Figure 13:
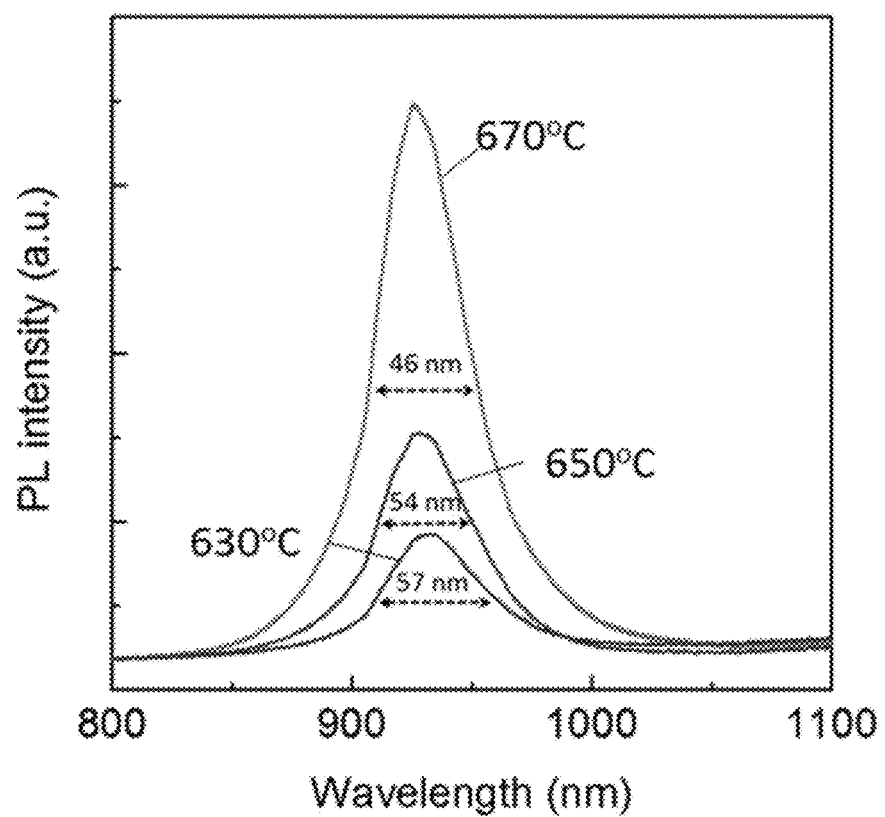
FIG. 13 is room temperature PL spectra of InP grown at 670° C., 650° C. and 630° C. respectively.

The optical properties of the lateral InP-epitaxial layer were studied using micro-PL measurements. Excitation was delivered by a continuous-wave 514 nm laser, and photon emission was gathered by a thermoelectric-cooled InGaAs detector. The excitation laser was focused into a rectangular-spot with a dimension of 40 µm×4 µm, and was aligned along the lateral InP-epitaxial direction during the measurement. FIG. 13 presents the room-temperature emission spectra of lateral InP-epitaxial layer grown at different temperatures.

The emission peak resides around 925 nm, attesting the zincblende structure of the lateral InP-epitaxial layer. As the growth temperature increases from 630° C. to 670° C., the peak intensity gradually increases and the spectral linewidth progressively narrows from 57 nm to 46 nm, in spite of increasing number of surface dents. The improved optical property might stem from the larger material volume and better crystalline quality at higher temperatures. It is also noticed a slight blue-shift of the emission peak as the growth temperature increases, which might result from the change of unintentional dopant concentration and the density of stacking faults. Note that, under similar excitation excitations, the PL line-width of planar InP (semi-insulating InP wafer) is around 20 nm. The relatively broader line-width of this epitaxial InP is attributed to the generated crystalline defects at the III-V/Si interface which disrupt the perfect stacking of crystal planes and thus broaden the emission spectra. The strong emission intensity and the narrow line-width of the PL spectra suggest an excellent crystalline quality of the lateral InP-epitaxial layer grown by the present method.

Example 2

This example discloses the growth of GaSb within the lateral trenches. A SOI substrate was provided and the lateral trenches were formed as indicated in Example 1. Afterwards, starting from the nucleation sites provided by the {111} Si seed facets of the lateral trenches, a GaAs wetting layer was grown with TEGa and TBA at 400° C. with a V/III ratio of 22. Afterwards, a reactor temperature was ramped up to 520° C. for the growth of high temperature GaSb layer with TEGa and trimethylantimony (TMSb) with a V/III ratio of 2.

Figure 14A:
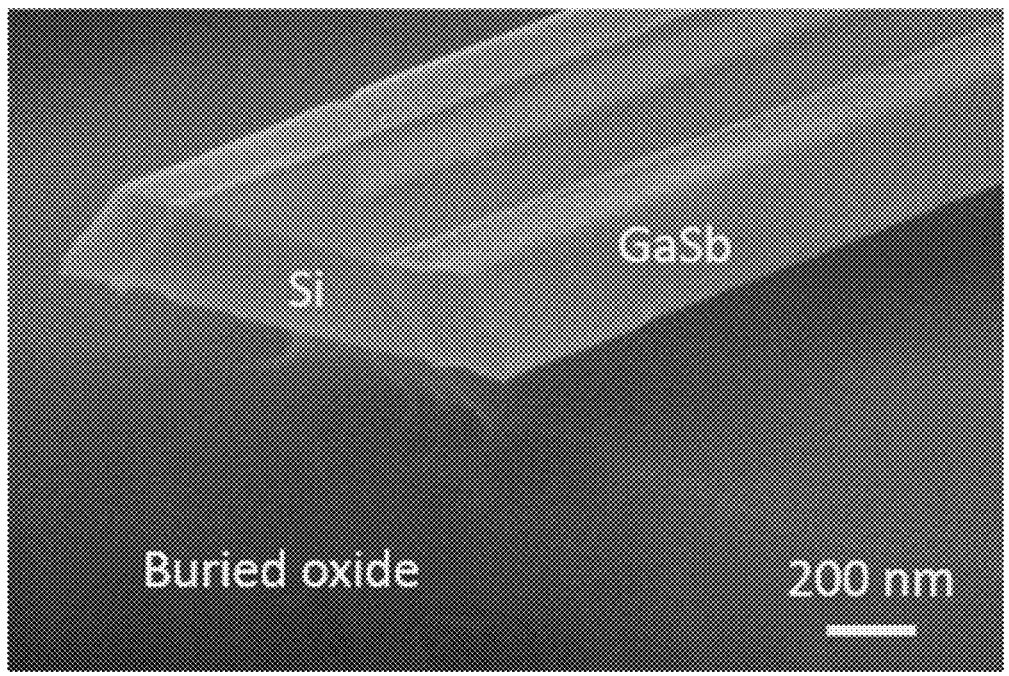
FIG. 14A is a tilted-view SEM image of nano-sized gallium antimonide (GaSb) crystals grown on SOI.

FIG. 14A is a tilted-view SEM image of nano-sized GaSb crystals grown on SOI. The top oxide layer was removed for a better morphology view. As shown in FIG. 14A, the GaSb layer has a uniform morphology and a {111}-oriented growth front.

Figure 14B:
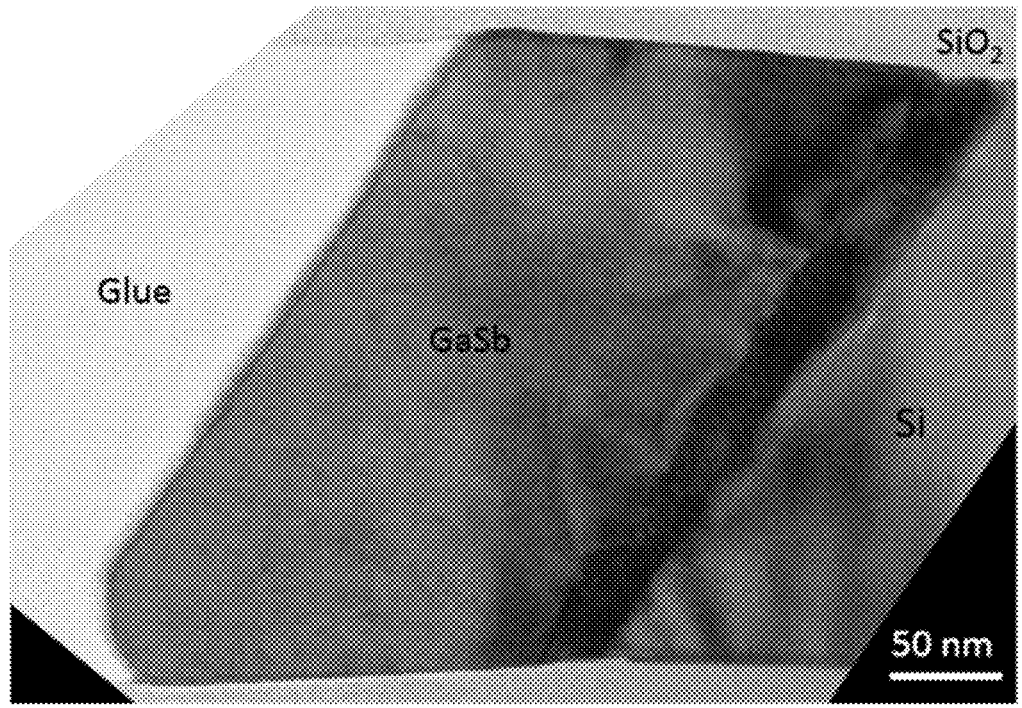
FIG. 14B is a cross-sectional TEM image of nano-sized GaSb crystals grown on SOI.

FIG. 14B is a cross-sectional TEM image of nano-sized GaSb crystals grown on SOI. As shown in FIG. 14B, the defects generated from lattice mismatches are mainly stacking faults and are confined at the GaSb/Si interface.

Thus, it can be seen that an improved method for growing III-V compound semiconductors on silicon-on-insulators have been disclosed which eliminates or at least diminishes the disadvantages and problems associated with prior art processes. The method provides direct lateral epitaxy of dislocation-free III-V nano/micro-layers on SOI wafers. By positioning Si nucleation sites between the top oxide layer and the buried oxide layer, the present method enables the selective lateral growth of dislocation-free III-V crystals right atop the buried oxide layer. The growth of nano-scale and micro-scale III-V crystals on SOI through coalescence of adjacent lateral InP-epitaxial layer can be achieved. Growth parameters can be engineered to manipulate the faceting and evolution of III-V alloys inside/outside the lateral trenches. This method can be applied to the epitaxy of III-V materials with other structures and compositions, and bring additional functionalities on current Si photonics chips.

Although the invention has been described in terms of certain embodiments, other embodiments apparent to those of ordinary skill in the art are also within the scope of this invention. Accordingly, the scope of the invention is intended to be defined only by the claims which follow.

What is claimed is:

1. A method for forming a III-V compound semiconductor thin film on a buried oxide layer of silicon-on-insulator comprising:
providing a layered (001)-oriented silicon-on-insulator substrate comprising a silicon (Si) device layer, the buried oxide layer, and a patterned mask layer, the Si device layer being sandwiched between the buried oxide layer and the patterned mask layer, the patterned mask layer comprising one or more vertical trenches formed in the patterned mask layer and located on the Si device layer such that one or more exposed Si surfaces are formed on the Si device layer;
starting from each exposed Si surface, anisotropic-etching the Si device layer laterally thereby forming one or more lateral trenches between the buried oxide layer and the patterned mask layer;
etching each lateral Si surface of each lateral trench by anisotropic wet etching thereby forming one or more {111}-oriented Si seed surfaces between the buried oxide layer and the patterned mask layer; and
starting from each {111}-oriented Si seed surface, growing an epitaxial layer of the III-V compound semiconductor thin film laterally within a respective lateral trench by metal organic chemical vapor deposition thereby forming one or more epitaxial layers between the buried oxide layer and the patterned mask layer such that each epitaxial layer has a non-defective portion and a defective portion, the defective portion being sandwiched between the {111}-oriented Si seed surface and the non-defective portion, the non-defective portion forming the III-V compound semiconductor thin film on the buried oxide layer,
said forming the one or more epitaxial layers between the buried oxide layer and the patterned mask layer comprising:
starting from each {111}-oriented Si seed surface, growing a nucleation layer of the III-V compound semiconductor thin film laterally within the respective lateral trench at a first growth temperature, said nucleation layer consisting of multiple nucleation sites;
starting from each nucleation layer, growing a main layer of the III-V compound semiconductor thin film laterally within the respective lateral trench at a second growth temperature such that each epitaxial layer comprises the nucleation layer and the main layer, the nucleation layer being sandwiched between the {111}-oriented Si seed surface and the main layer;
said nucleation layer and main layer having the same growth front direction such that planar disorders including stacking faults generated due to lattice mismatch between the III-V compound semiconductor thin film and the {111}-oriented Si seed surface either are trapped right at an interface between the nucleation layer and the {111}-oriented Si seed surface or propagate into the main layer of the epitaxial layer in the {111} direction and then terminate at the buried oxide layers;
said nucleation layer and main layer being grown by metal organic chemical vapor deposition (MOCVD); and
said nucleation layer being grown under a higher V/III ratio but a lower growth temperature than those for growing said main layer.

2. The method of claim 1, wherein the defective portion has a width between 1.3d and 1.5d, d being a thickness of the Si device layer.

3. The method of claim 1, wherein the III-V compound semiconductor thin film is indium phosphide (InP), gallium arsenide (GaAs), gallium antimonide (GaSb), Indium arsenide (InAs), a ternary alloy thereof, or a quaternary alloy thereof.

4. The method of claim 1, wherein the Si device layer has a thickness between 1 nm and 1000 nm.

5. The method of claim 1, wherein the buried oxide layer comprises $SiO_2$ layer and has a thickness between 1 nm and 2000 nm.

6. The method of claim 1, wherein the patterned mask layer comprises $SiO_2$, SiN or $Al_2O_3$; and each vertical trench has a width between 1 nm and 100 μm.

7. The method of claim 1, wherein the patterned mask layer is a patterned top oxide layer having a thickness between 1 nm and 1000 nm.

8. The method of claim 1, wherein the anisotropic wet etching comprises potassium hydroxide (KOH) or tetramethylammonium hydroxide (TMAH).

9. The method of claim 1, wherein the first growth temperature is between 350° C. and 450° C.; and the second growth temperature is between 450° C. and 750° C.

10. The method of claim 1 further comprising:
removing the patterned mask layer after the step of growing the one or more epitaxial layers; and
removing the defective portion of each epitaxial layer.

11. The method of claim 1, wherein the layered (001)-oriented silicon-on-insulator (SOI) substrate is prepared by the steps of:
providing the layered (001)-oriented silicon-on-insulator (SOI) substrate comprising the Si device layer, the buried oxide layer and a Si handle layer, the buried oxide layer being sandwiched by the Si device layer and the Si handle layer;
oxidizing a top surface of the Si device layer thereby forming a mask layer on the Si device layer; and
patterning and etching the mask layer thereby forming the patterned mask layer.

12. A method for growing a III-V compound semiconductor thin film on a buried oxide layer of silicon-on-insulator comprising:
providing a layered (001)-oriented silicon-on-insulator substrate comprising a Si device layer, the buried oxide layer, and a patterned mask layer, the Si device layer being sandwiched between the buried oxide layer and the patterned mask layer, the patterned mask layer comprising one or more vertical trenches formed in the patterned mask layer and located on the Si device layer such that one or more exposed Si surfaces are formed on the Si device layer;

starting from each exposed Si surface, anisotropic-etching the Si device layer laterally thereby forming one or more lateral trenches between the buried oxide layer and the patterned mask layer;

etching each lateral Si surface of each lateral trench by anisotropic wet etching thereby forming one or more {111}-oriented Si seed surfaces between the buried oxide layer and the patterned mask layer;

growing a wetting layer laterally on each lateral Si surface by first metal organic chemical vapor deposition; and starting from each wetting layer, growing an epitaxial layer of the III-V compound semiconductor thin film laterally within a respective lateral trench by second metal organic chemical vapor deposition thereby forming one or more epitaxial layers between the buried oxide layer and the patterned mask layer such that each epitaxial layer has a non-defective portion and a defective portion, the defective portion being sandwiched between the {111}-oriented Si surface and the non-defective portion, the non-defective portion forming the region of the III-V compound semiconductor thin film on the buried oxide layer, said forming the one or more epitaxial layers comprises:

starting from each wetting layer, growing a nucleation layer of the III-V compound semiconductor thin film laterally within the respective lateral trench at a first growth temperature, said nucleation layer consisting of multiple nucleation sites; and starting from each nucleation layer, growing a main layer of the III-V compound semiconductor thin film laterally within the respective lateral trench at a second growth temperature such that each epitaxial layer comprises the nucleation layer and the main layer, the nucleation layer being sandwiched between the wetting layer and the main layer;

said nucleation layer and main layer having the same growth front direction such that planar disorders including stacking faults generated due to lattice mismatch between the III-V compound semiconductor thin film and the {111}-oriented Si seed surface either are trapped right at an interface between the nucleation layer and the {111}-oriented Si seed surface or propagate into the main layer of the epitaxial layer in the {111} direction and then terminate at the buried oxide layers;

said wetting layer, said nucleation layer and said main layer being grown by metal organic chemical vapor deposition (MOCVD); and said nucleation layer being grown under a higher V/III ratio but a lower growth temperature than those for growing said main layer.

13. The method of claim 12, wherein the wetting layer comprises GaAs, gallium phosphide (GaP) or InAs and has a width between 1 and 50 nm.

14. The method of claim 12 further comprising:

removing the patterned mask layer after the step of growing the one or more epitaxial layers; and removing the one or more wetting layers and the defective portion of each epitaxial layer.

* * * * *